United States Patent
Akiyama

(10) Patent No.: US 7,697,356 B2
(45) Date of Patent: Apr. 13, 2010

(54) METHOD OF TESTING SEMICONDUCTOR APPARATUS

(75) Inventor: Naoto Akiyama, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 139 days.

(21) Appl. No.: 11/987,082

(22) Filed: Nov. 27, 2007

(65) Prior Publication Data

US 2008/0181036 A1    Jul. 31, 2008

(30) Foreign Application Priority Data

Nov. 28, 2006  (JP) ............................. 2006-319583

(51) Int. Cl.
*G11C 7/00*    (2006.01)
(52) U.S. Cl. .................... 365/201; 365/154; 365/189.09
(58) Field of Classification Search ................ 365/154, 365/189.09, 201
See application file for complete search history.

(56) References Cited

U.S. PATENT DOCUMENTS

| 2005/0093612 A1* | 5/2005 | Gilliam ...................... 327/534 |
| 2005/0099202 A1* | 5/2005 | Houston et al. ............. 324/765 |
| 2005/0111272 A1* | 5/2005 | Hong ......................... 365/201 |

FOREIGN PATENT DOCUMENTS

JP    2002-93195    3/2002

* cited by examiner

*Primary Examiner*—Hoai V Ho
(74) *Attorney, Agent, or Firm*—McGinn, IP Law Group, PLLC

(57) ABSTRACT

A method of testing a semiconductor apparatus performs a function test of reading data from memory cells in SRAM by applying a potential lower than a GND potential to a backgate of an n-type MOS transistor with a drain connected with a storage node and a source connected with the GND potential. Then, the method performs a function test of reading data from memory cells by applying a potential higher than the GND potential to the backgate.

8 Claims, 6 Drawing Sheets

|  | BACK BIAS | FORWARD BIAS |
|---|---|---|
| Vth | LARGE | SMALL |
| Ion | SMALL | LARGE |
| Ioff | SMALL | LARGE |
| DEFECT | LEAKAGE DEFECT WRITING DIFFICULTY | SNM |
| TEMPERATURE TEST | LOW TEMPERATURE | HIGH TEMPERATURE |

Fig. 4

METHOD OF TESTING SEMICONDUCTOR APPARATUS

BACKGROUND OF THE INVENTION

1. Field of the Invention

The present invention relates to a method of testing a semiconductor apparatus suitable for detecting a defective cell due to a defective standby current or SNM (static noise margin) deficiency.

2. Description of Related Art

Normally, when testing a memory cell such as RAM (Random Access Memory), a BIST (built in self-test) is performed (step S101), a fail bit is read (step S102), and a defective cell is replaced with a redundancy cell by cutting a fuse (step S103), as shown in FIG. 6.

However, in some cases, a cell which places the border of a defective cell and a non-defective cell remains without being replaced. In such a case, there is a problem that memory malfunctioning is likely to occur depending on the LSI use environment, that is, by a temperature or voltage change. Defective modes include a write/read defect caused by the varying threshold of a field-effect transistor constituting a memory cell and an unstable operation caused by the deficiency of SNM, in addition to a leakage defect that has been a problem. These defective modes are aggravated as miniaturization progresses, which raises a problem of a cost increase due to the need for a high-temperature/low-temperature test for reliable removal of a defective cell or the like.

Japanese Unexamined Patent Application Publication No. 2002-93195 (Shiomi) discloses a method of testing a semiconductor apparatus of which object is detecting a defect of a direct-current electricity such as a standby current defect and saving a defective cell. FIG. 7 is a view of an SRAM disclosed by Shiomi. The method of testing a semiconductor apparatus taught by Shiomi aims at identifying and saving a defective cell when a standby current flows in the SRAM due to a minute leakage.

As shown in FIG. 7, a memory cell M1 includes an n-channel MOS transistor 80 and an n-channel MOS transistor 82. The n-channel MOS transistor 80 is connected between a bit line BL1 and a storage node N10, and its gate is connected with a word line WL1. The n-channel MOS transistor 82 is connected between a bit line /BL1 and a storage node N11, and its gate is connected with a word line WL1.

The memory cell M1 further includes an n-channel MOS transistor 74 and an n-channel MOS transistor 78. The source of the n-channel MOS transistor 74 is connected with the ground voltage GNDM of a memory cell array, the drain is connected with a storage node N10, and the gate is connected with a storage node N11. The source of the N-channel MOS transistor 78 is connected with the ground voltage GNDM, the drain is connected with the storage node N11, and the gate is connected with the storage node N10.

The memory cell M1 further includes a p-channel MOS transistor 72 and a p-channel MOS transistor 76. The source of the p-channel MOS transistor 72 is connected with a power supply voltage VCCM for a memory cell array, the drain is connected with the storage node N10, and the gate is connected with the storage node N11. The source of the p-channel MOS transistor 76 is connected with the power supply voltage VCCM, the drain is connected with the storage node N11, and the gate is connected with the storage node N10.

It is assumed that the storage node N11 of the memory cell M1 is coupled with the power supply voltage VCCM of the memory cell array by a resistor R1 to cause short-circuit. The memory cell M1 is capable of controlling the ground voltage GNDP, which is a substrate voltage of the n-channel MOS transistors 74 and 78 that constitute a memory cell of SRAM, independently of the ground voltage GNDM, which is a source voltage. When the storage node N11 is "L", a through current flows in the pass indicated by the arrow. Since the through current keeps flowing in a standby condition, the semiconductor apparatus has a standby defect. When the standby current defect occurs, GNDP is set lower than GND (back bias). As a result, the drive ability of the n-channel MOS transistors 74 and 78 is weakened by body effect. This enables to detect a defect by a function test. It is therefore possible to identify a defective memory cell and replace the defective cell with a redundancy cell, thereby improving process yield.

However, the method taught by Shiomi only controls a threshold to be higher by applying a back bias. Therefore, although it has a tentative effect that the memory cell which has leakage is easily identified, the method is incapable of detecting the defective mode that becomes more significant as the threshold of the field-effect transistor becomes lower (or a cell current becomes higher), such as an SNM defect.

SUMMARY

In one embodiment, there is provided a method of testing a semiconductor apparatus including a memory including a plurality of memory cells arranged in matrix, each memory cell including a storage node to store data. The method includes performing a function test of writing data to the memory cells and/or reading data from the memory cells by applying a second potential higher than a first potential to a backgate of a field-effect transistor with a drain connected with the storage node and a source receiving the first potential, and performing a function test of writing data to the memory cells and/or reading data from the memory cells by applying a third potential lower than the first potential to the backgate of the field-effect transistor.

In another embodiment, there is provided a method of testing a semiconductor apparatus including a memory including a plurality of memory cells arranged in matrix, each memory cell including a storage node to store data. The method includes performing a function test of writing data to the memory cells and/or reading data from the memory cells by applying a second potential higher than a first potential to a backgate of an n-type field-effect transistor with a drain connected with the storage node and a source receiving the first potential, and detecting a defective cell.

According to the embodiments of the present invention, a memory cell is tested with a forward bias by applying a positive electric potential to a P well if a field-effect transistor is an N type and by applying a negative electric potential to an N well if a field-effect transistor is a P type. It is thereby possible to test the memory cell with small SNM and improve the detection sensitively of an SNM defect. It is also possible to improve the detection sensitively of another defective mode which is hard to detect in normal condition by controlling a bias to be applied to each well independently of each other.

According to the present invention, it is possible to provide a method of testing a semiconductor apparatus which has a high detection sensitivity of the defective mode which becomes significant by a decrease in a threshold (or an increase in a cell current).

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a view showing the features when a forward bias is applied and when a back bias is applied as shown in FIGS. 2 and 3, respectively;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
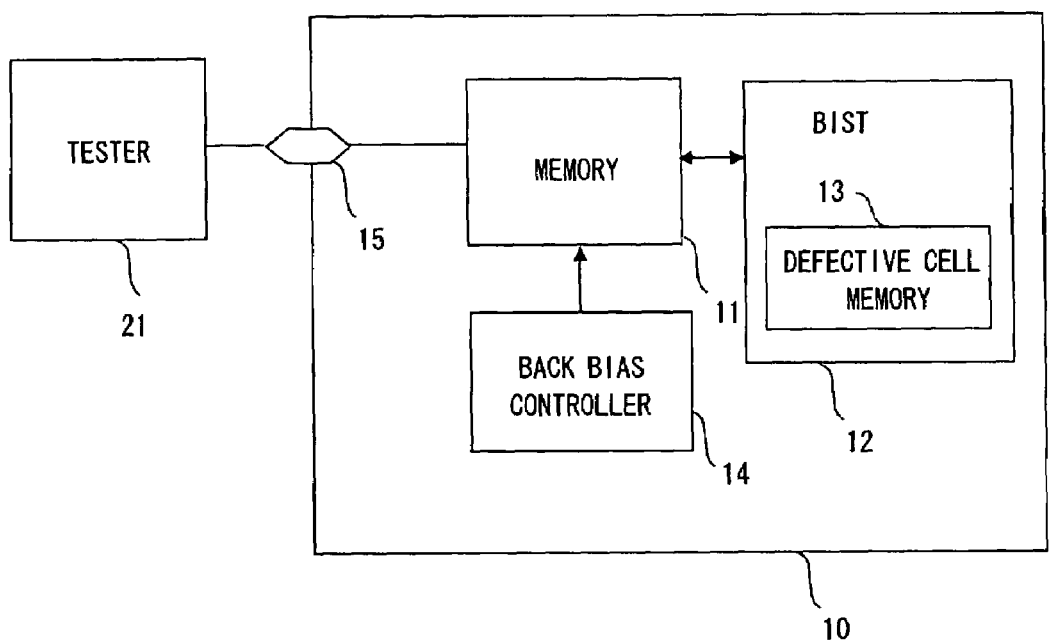
FIG. 1 is a schematic diagram showing a semiconductor apparatus according to an embodiment of the present invention.

Exemplary embodiments of the present invention are described hereinafter in detail with reference to the drawings. FIG. 1 is a schematic diagram showing a semiconductor apparatus according to an embodiment of the present invention. A semiconductor apparatus 10 includes a memory 11, a BIST 12, a back bias control circuit 14, and a terminal 15 for test. The BIST 12 includes a defective cell memory 13 which stores a defective address when a defective cell is detected. The defective cell memory 13 may be placed outside of the BIST.

The back bias control circuit 14 controls the back bias of the N channel and P channel transistors that constitute a memory. In this embodiment, the back bias control circuit 14 supplies a back gate of an N channel transistor with a potential higher than GND (hereinafter referred to as "forward bias") or a potential lower than GND (hereinafter referred to as "back bias"). The back bias control circuit 14 also supplies a back gate of a P channel transistor with a potential higher than VDD (back bias) or lower than VDD (forward bias). The back bias control circuit 14 controls the biases applied to each well independently of each other.

Alternatively, the back bias of the memory 11 may be controlled by connecting a tester 21 to the memory through the terminal 15 for test. The tester 21 may input not only a back bias but also a test pattern or the like to the semiconductor apparatus.

Figure 2:
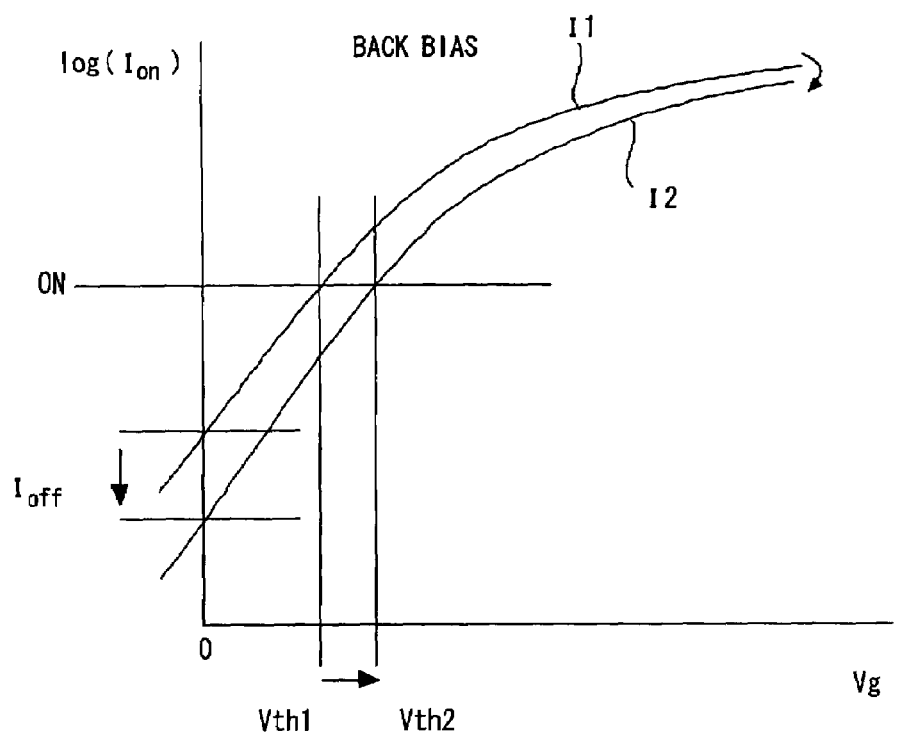
FIG. 2 is a view showing a change in a threshold voltage when a back bias is applied.

The principle that enables the detection of a defect by the back bias and the forward bias is described hereinafter. FIG. 2 is a view showing a change in a threshold voltage when a back bias is applied, FIG. 3 is a view showing a change in SNM when a forward bias is applied, and FIG. 4 is a view showing the features when a forward bias is applied and when a back bias is applied as shown in FIGS. 2 and 3, respectively.

In FIG. 2, I1 indicates a current of a transistor before applying a back bias, I2 indicates a current of a transistor after applying a back bias. As shown in FIGS. 2 and 4, a threshold Vth becomes larger from Vth1 to Vth2 by the back bias application, and an ON current $I_{ON}$ becomes smaller from I1 to I2. Further, when a voltage=0, a leakage current $I_{off}$ becomes smaller by the back bias application.

As just described, the back bias application deepens a threshold voltage, lowers the driven ability of a transistor, and reduces a leakage current. Thus, the leakage current can be detected easily. Further, as a threshold voltage becomes higher, a defect that reading or writing to a memory cell fails is likely to occur. It is thereby possible to improve the detection sensitively of a defective cell transistor of which threshold varies in relatively high values. In addition, this reproduces the operating condition at a low temperature in pseudo. Thus, performing writing by applying a back bias and then performing a read test have the same effect as performing a test at a low temperature, so that a test cost decreases.

Figure 3:
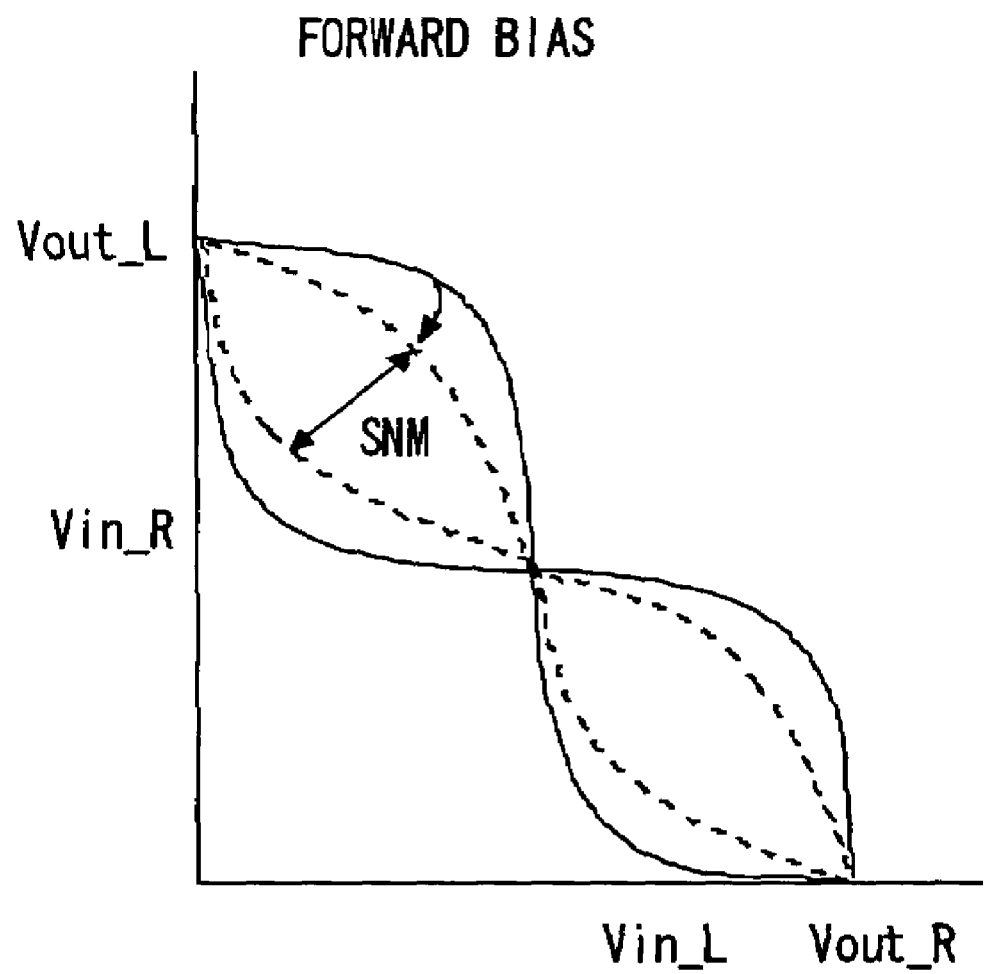
FIG. 3 is a view showing a change in SNM when a forward bias is applied.

FIG. 3 is a pattern diagram of a so-called butterfly curve which shows the stability of an inverter (cell). SNM is defined as shown in FIG. 3. A memory cell operates more stably as an SNM value is larger. Thus, the memory cell which has large SNM has high noise tolerance in keeping data. Generally, as a difference in the threshold of a pair of inverters (L, R) constituting an SRAM cell is greater, SNM is larger. By applying a positive and negative substrate bias, the SNM value can be controlled. Specifically, when a forward bias is applied, the butterfly curve changes from a solid line to a dotted line in FIG. 3, and SNM gets smaller.

As shown FIG. 4, the forward bias application controls a threshold voltage to be lower, heightens the drive ability, and increases an ON current and a leakage current. Because the threshold voltage becomes lower, it is possible to improve the detection sensibility of an SNM defect as shown in FIG. 3. In addition, this reproduces the operating condition at a high temperature in pseudo. Thus, performing writing by applying a forward bias and then performing a read test have the same effect as performing a test at a high temperature, so that a test cost decreases.

Figure 5:
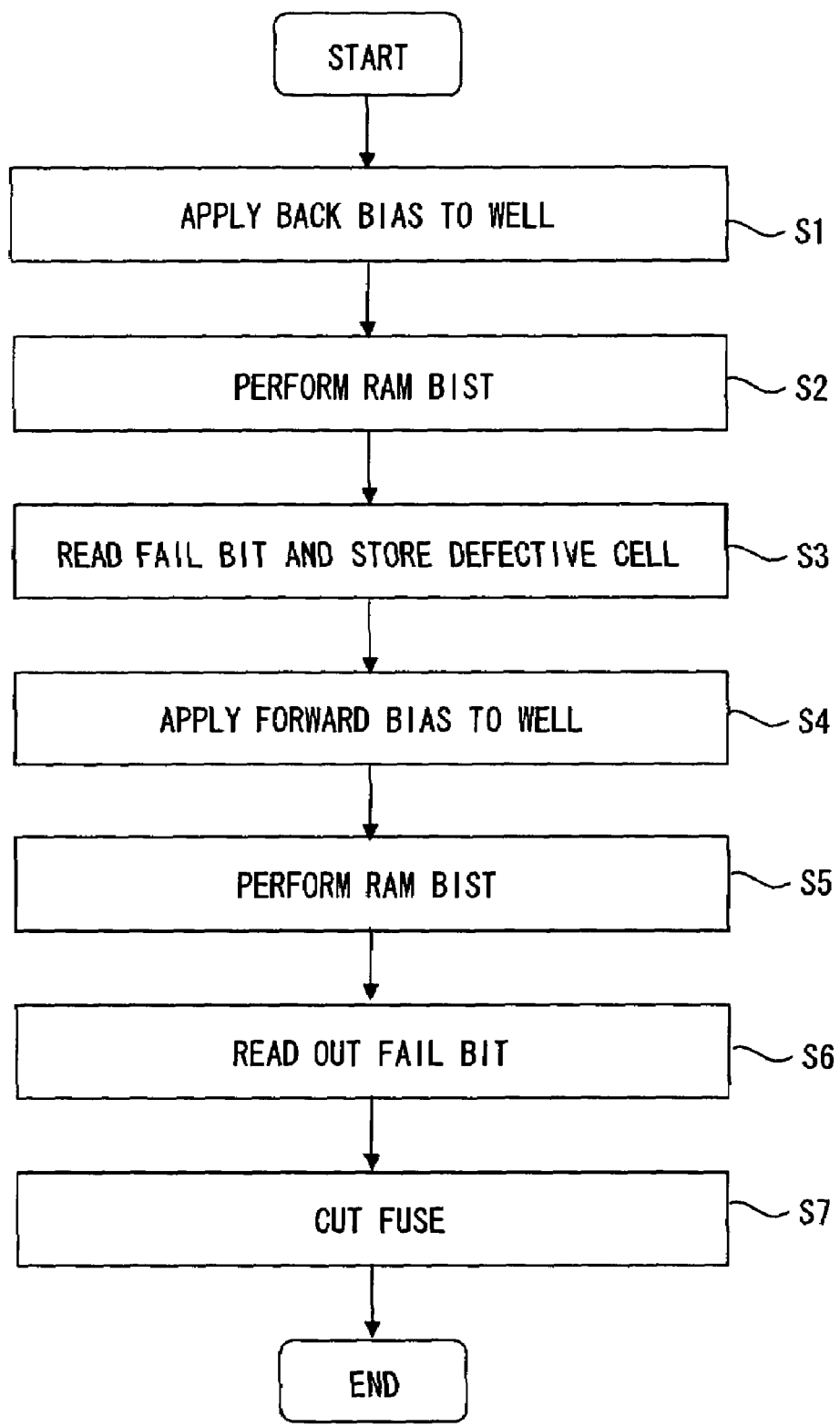
FIG. 5 is a flow chart showing a method of testing a semiconductor apparatus according to the embodiment of the present invention.
Figure 6:
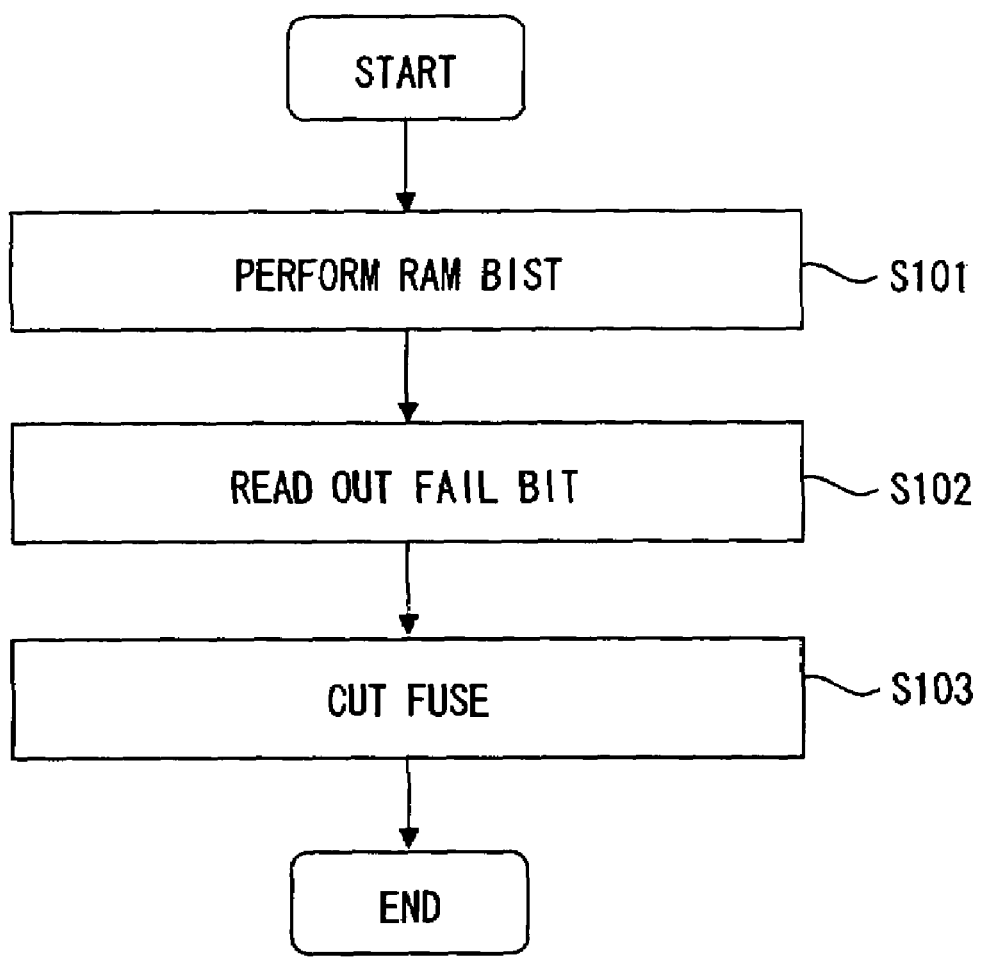
FIG. 6 is a flow chart showing a method of testing a semiconductor apparatus according to a related art.
Figure 7:
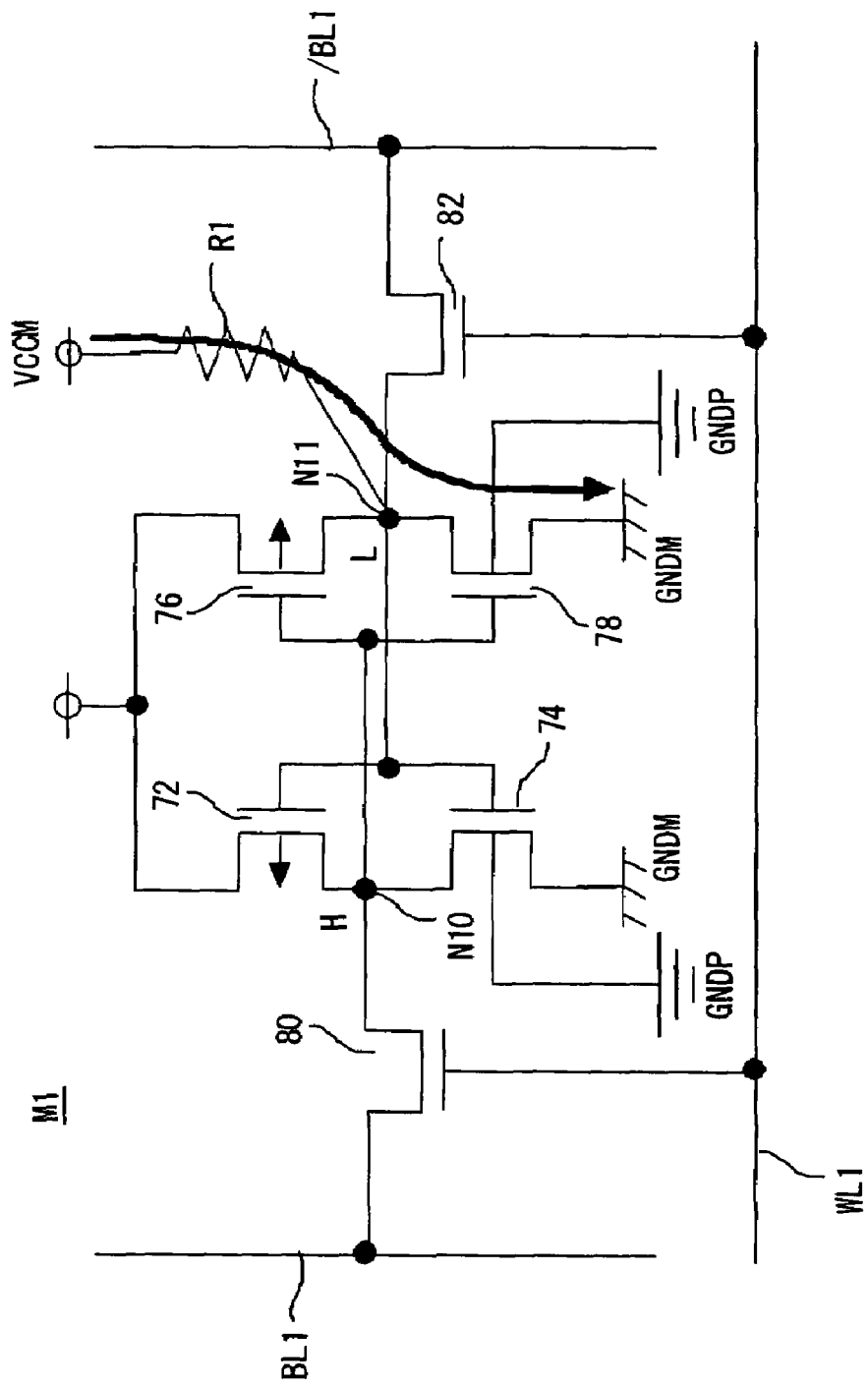
FIG. 7 is a view showing an SRAM disclosed by Shiomi.

A method of testing a semiconductor apparatus according to an embodiment of the present invention is described hereinafter. FIG. 5 is a flow chart showing the method of testing a semiconductor apparatus according to this embodiment. As shown in FIG. 5, first, a back bias (inverted bias) is applied to each well (step S1). Specifically, if it is an n-MOS transistor, a negative potential is supplied to a P well, and if it is a p-MOS transistor, a positive potential is supplied to an N well. Then, RAM BIST is performed (step S2), and a fail bit is read out (step S3). By applying a back bias, a leakage defect and a cell which is difficult to write can be detected. In this bout, the defective cell memory 13 stores the address where a fail bit is generated.

Next, a forward bias is applied to each well (step S4). Specifically, if it is an n-MOS transistor, a positive potential is supplied to a P well, and if it is a p-MOS transistor, a negative potential is supplied to an N well. Then, RAM BIST is performed (step S5), and a fail bit is read out (step S6). By applying a forward bias, a defective cell having small SNM can be detected. Then, a fail cell having the fail address stored in step S3 and the memory cell having the fail address read out in step S6 are replaced with displacement cells by cutting a fuse (step S7). In this case, two fuses are cut: one for selecting a displacement cell and one for stopping the supply of a power supply current to a defective cell.

According to this embodiment, a defect detection test of a memory is performed by applying not only a back bias but also a forward bias, so that a defective cell of which threshold varies in high values as well as low values can be detected. Specifically, it is possible to produce the condition of performing a test at a high temperature and at a low temperature in pseudo, thus eliminating the need for performing a high temperature test and a low temperature test. This enables reduction of a test time and cost. By adapting this test, a defective cell due to a large variety of defect modes such as a leakage defect, a write defect and an SNM defect can be detected.

The present invention is not limited to the embodiment described above, and a variety of modifications that do not depart from the gist of the invention are possible. For example, although the test shown in FIG. 5 performs a test with the forward bias application after performing a test with the back bias application, it may perform a test with the back bias application after performing a test with the forward bias application. Further, although a test is performed by applying both a back bias and a forward bias, it may be performed by applying only a forward bias. The test with the forward bias application enables the detection of an SNM defect. Further, the detection sensitivity of other modes, which are difficult to detect in normal operation, can be improved by controlling a voltage applied to each well independently or by combining a back bias and a forward bias.

Furthermore, although the RAM BIST is performed with the back bias and forward bias application in the above-described embodiment, a reading or writing test may be performed by a tester. Although a large variety of tests are performed in the memory, it is not necessary to perform a test with the back bias and forward bias application in all tests.

It is apparent that the present invention is not limited to the above embodiments, but may be modified and changed without departing from the scope and spirit of the invention.

What is claimed is:

1. A method of testing a semiconductor apparatus including a memory including a plurality of memory cells arranged in matrix, each memory cell including a storage node to store data, the method comprising:
    performing a function test of writing data to the memory cells and/or reading data from the memory cells by applying a second potential higher than a first potential to a backgate of a field-effect transistor with a drain connected with the storage node and a source receiving the first potential; and
    performing a function test of writing data to the memory cells and/or reading data from the memory cells by applying a third potential lower than the first potential to the backgate of the field-effect transistor.

2. The method of testing a semiconductor apparatus according to claim 1, wherein a back bias controller connected with the memory controls a potential applied to the backgate.

3. The method of testing a semiconductor apparatus according to claim 1, wherein a tester connected with the memory through an external terminal controls a potential applied to the backgate.

4. A method of testing a semiconductor apparatus including a memory including a plurality of memory cells arranged in a matrix, each memory cell including a storage node to store data, the method comprising:
    performing a first function test of writing data to the memory cells and/or reading data from the memory cells, each of said memory cells having a field-effect transistor, said field-effect transistor having a drain thereof coupled to said storage node, a source thereof and a backgate thereof supplied with a higher potential than that of said source during said first function test;
    performing a second function test of writing data to the memory cells and/or reading data from the memory cells, each of said field-effect transistors having said backgate thereof supplied with a lower potential than that of said source during said second function test;
    storing an address of a fail bit detected in one of said first and second function tests to another memory no later than another of said first and second function tests; and
    replacing a defective memory cell with a displacement cell based on the another memory after the another of said first and second function tests.

5. The method of testing a semiconductor apparatus according to claim 4, wherein a back bias controller is provided within the semiconductor apparatus and controls the potential applied to the backgate.

6. The method of testing a semiconductor apparatus according to claim 4, wherein a tester connected with the memory, through an external, controls a potential applied to the backgate.

7. The method of testing a semiconductor apparatus according to claim 4, wherein said another memory is provided within the semiconductor apparatus.

8. The method of testing a semiconductor apparatus according to claim 4,
    wherein said semiconductor apparatus comprises a first fuse and a second fuse, said first fuse being configured to indicate a selection of said displacement cell when it is cut, said second fuse being configured to indicate a termination of a power supply to said defective cell when it is cut, and
    wherein said replacing includes cutting said first and second fuses responsive to said addresses.

* * * * *